United States Patent
Azotea

(10) Patent No.: US 6,188,575 B1
(45) Date of Patent: Feb. 13, 2001

(54) HEAT EXCHANGING CHASSIS AND METHOD

(75) Inventor: James Kevin Azotea, Saratoga Springs, NY (US)

(73) Assignee: Intersil Corporation, Palm Bay, FL (US)

( * ) Notice: Under 35 U.S.C. 154(b), the term of this patent shall be extended for 0 days.

(21) Appl. No.: 09/107,273

(22) Filed: Jun. 30, 1998

(51) Int. Cl.⁷ .................................................. H05K 7/200
(52) U.S. Cl. ................... 361/701; 165/104.19; 307/150; 361/718
(58) Field of Search .............................. 307/98, 89, 150; 257/707, 714, 704, 706, 712, 713, 723, 724, 726; 361/699, 689, 701, 704, 707, 711, 715–718, 719; 165/80.3, 185, 80.4, 104.19, 104.33

(56) References Cited

U.S. PATENT DOCUMENTS

| | | | |
|---|---|---|---|
| 3,643,131 | * | 2/1972 | Scherbaum . |
| 3,706,010 | * | 12/1972 | Laemer . |
| 4,010,489 | * | 3/1977 | Bourbeau . |
| 4,029,141 | * | 6/1977 | Ferrari . |
| 4,338,652 | * | 7/1982 | Romanczuk . |
| 4,956,746 | * | 9/1990 | Gates, Jr. . |
| 5,043,797 | * | 8/1991 | Lopes . |
| 5,095,973 | * | 3/1992 | Toy . |
| 5,119,174 | * | 6/1992 | Chen . |

\* cited by examiner

Primary Examiner—Gerald Tolin
(74) Attorney, Agent, or Firm—Carter, Ledyard & Milburn

(57) ABSTRACT

A novel and apparatus for cooling, supporting, and packaging power electronics. An elongated heat exchanger having a rectangular cross-section may carry and cool plural electronic devices. Plural heat exchangers may be arranged to form a chassis for two-sided cooling. Electronic devices on the heat exchangers may be interconnected and configured using circuitry bonded to a power pack cover. Circuitry on the cover, e.g., for reducing internal inductance, CTE mismatch and preventing voltage overshoot at turn-off, may be cooled through physical connections with electronic devices carried by the heat exchangers.

6 Claims, 7 Drawing Sheets

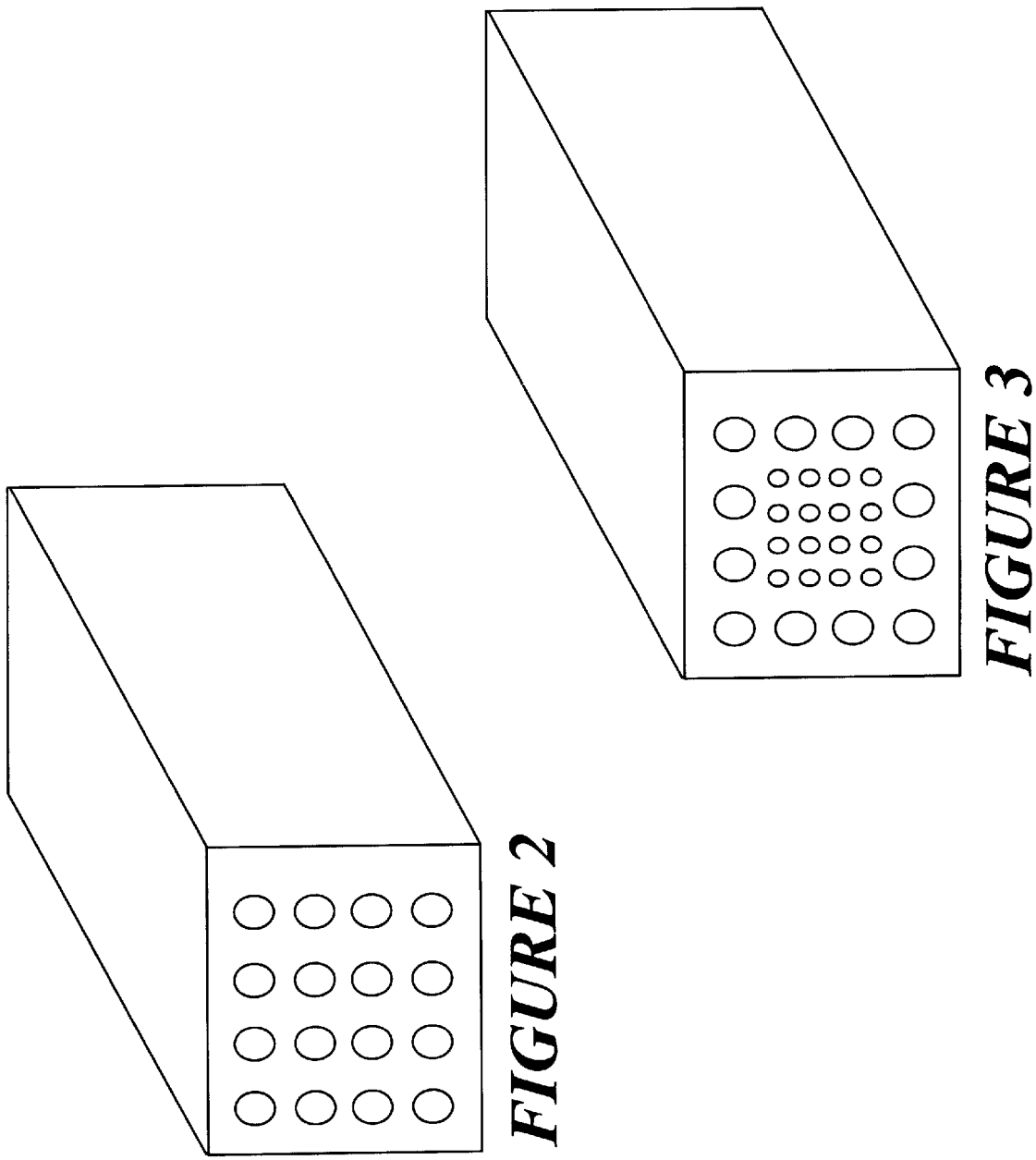

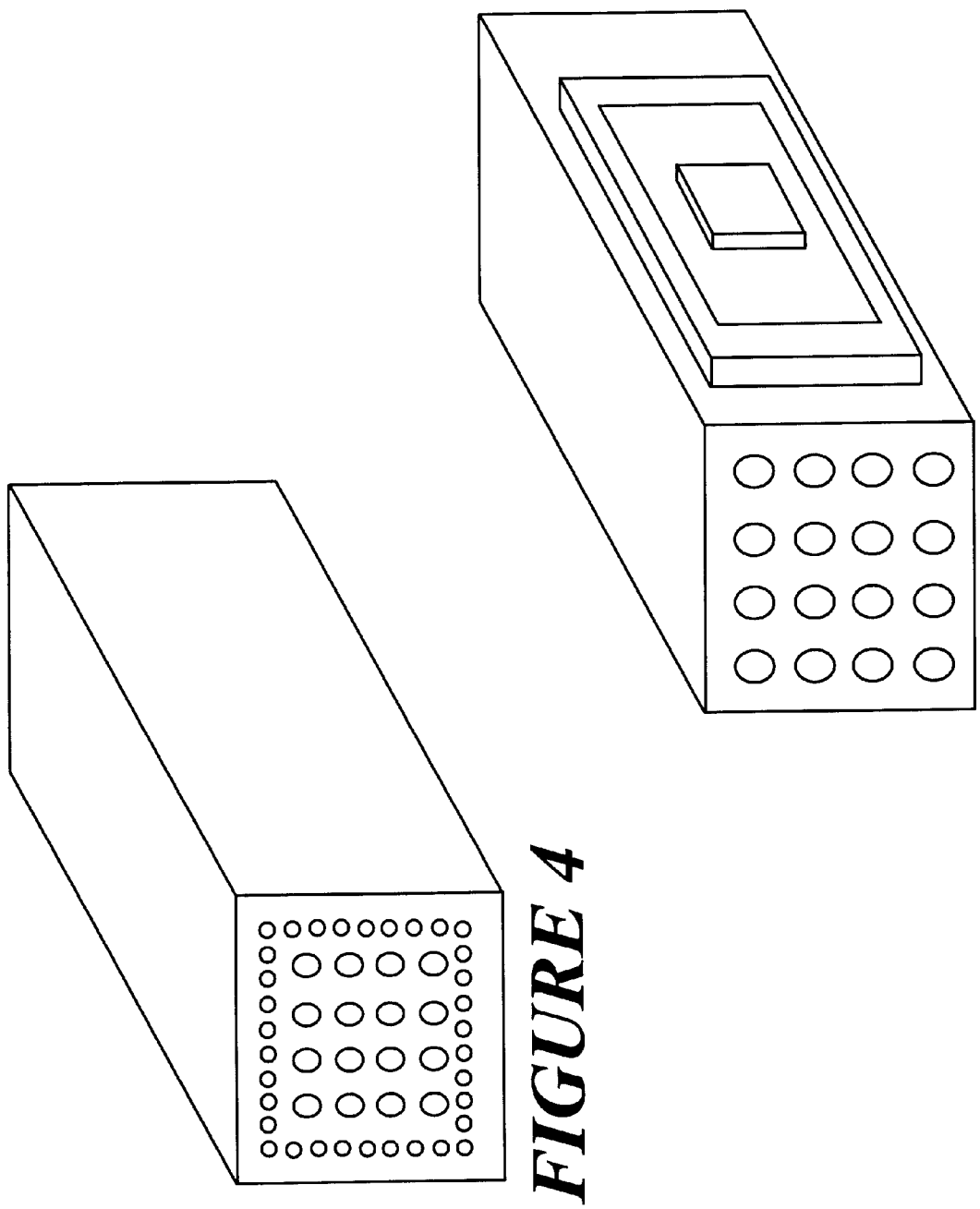

PICTORIAL

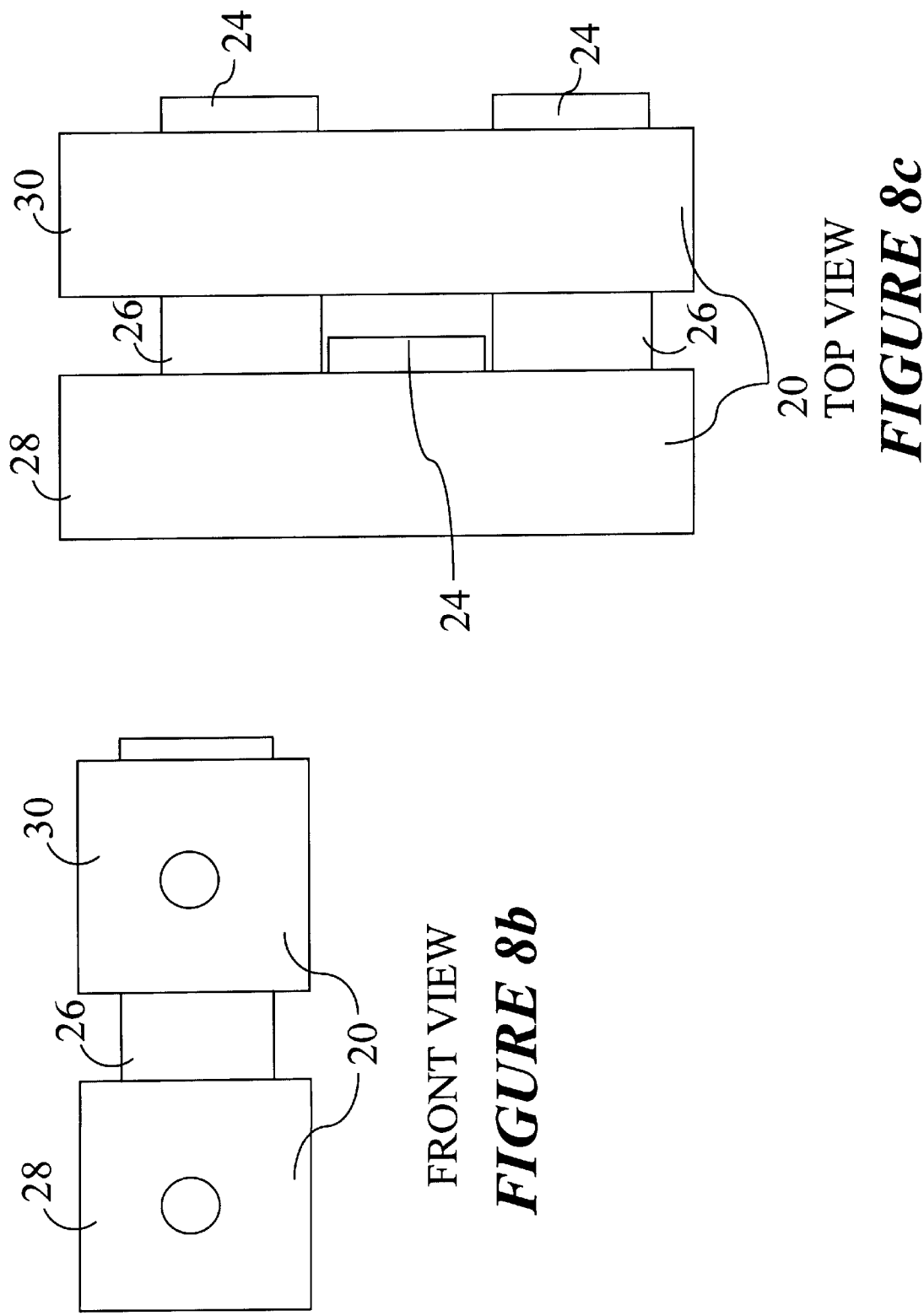

HEAT EXCHANGING CHASSIS AND METHOD

BACKGROUND OF THE INVENTION

The invention relates to power packs and, more specifically, to complex power packs with integrated cooling.

This application is related to application Ser. No. 09/040,112 filed Mar. 18, 1998 for "Semiconductor Power Pack" by Azotea et. al., the contents of which is incorporated herein in its entirety by reference.

Power pack manufacturers of today have not yet solved the built in problems of power pack geometries. These problems may include: suitable thermal management, "turn-off" inductance, and complicated device configuration.

In the power industry, issues concerning thermal interface, case temperature, and the cost of thermal management are generally not the responsibility of most manufacturers. A common practice in the power industry is to achieve maximum power levels by increasing the thermal gradient between the junction temperature of the silicon die and a "cold plate". Increasing the thermal gradient does not solve the underlying problem of an inadequate case-to-heat sink interface but adds cost and volume to the system design.

The forward blocking voltage (BVf) of power packs must be de-rated by the total internal inductance of the power pack multiplied by the rate of change of the peak turn-off current. The inductance values in power packs vary with geometry and are mostly a function of wiring length and mutual inductance.

Power packs having only one power device (e.g., one semiconductor power switch) may be referred to as power modules. A power pack may include plural power modules.

One known power module design includes a base plate, a lid, and a power device sandwiched between the lid and base plate. Such power modules may be single or double sided cooled but may not provide an optimum mounting and cooling area as compared to the total volume of the module.

For more complex power packs (i.e., two or more power devices in a power pack), the problems of providing a low volume package with suitable cooling (e.q., heat exchangers) and providing simultaneous operation of multiple power devices within a power pack having inductance remain.

One known technique for cooling involves attaching a heat exchanger to each individual power device in a power pack. The size and complexity of the power pack increases as the number of devices to be cooled increases, since each heat exchanger must have access to a coolant.

As for simultaneous operation of several power devices or even several power modules in one power pack, the driver circuitry may be located a distance away from the power device which increases the inductance of the power pack because of the extra lead length necessary to reach the power pack from the driver circuit. In parallel power device applications, the increased inductance may cause voltage over-shoot on turn-off which may damage power pack components.

Accordingly, it is an object of the present invention to provide a novel power pack.

It is another object of the present invention to provide a novel method of cooling a power device.

It is yet another object of the present invention to provide a novel heat exchanger.

It is still another object of the present invention to provide a novel method of cooling electronic devices.

It is a further object of the present invention to provide a novel method of providing structural support and cooling for heat generating electronic devices.

It is yet a further object of the present invention to provide a novel power pack having a heat exchanger as a chassis.

It is still a further object of the present invention to provide a novel power pack having increased power dissipation, decreased forward break down voltage derating factor, low inductance, and multiple power device configurations from the use of internal or external circuits.

It is yet still a further object of the present invention to provide a novel power pack in which a snubber capacitor may be implemented to limit the voltage over-shoot and to manage stray inductance. By locating the snubber cap on the cover and making the connection from the device to the snubber capacitor very short, coefficient of thermal expansion (CTE) problems are reduced, and less inductance between the power device and the capacitor is created making the snubber more effective. Additionally, the impedance may be matched.

It is yet still another object of the present invention to provide a novel power pack in which the cost is significantly reduced by mass producing the power device and effecting the configuration thereof by changing the external circuit.

These and many other objects and advantages of the present invention will be readily apparent to one skilled in the art to which the invention pertains from a perusal of the claims, the appended drawings, and the following detailed description of the preferred embodiments.

BRIEF DESCRIPTION OF THE DRAWINGS

FIG. 2 is a pictorial view of a second embodiment of the heat exchanger of the present invention illustrating variations in the size of the fluid passageways.

FIG. 3 is a pictorial view of a third embodiment of the heat exchanger of the present invention illustrating variations in the size of the fluid passageways.

FIG. 4 is a pictorial view of a fourth embodiment of the heat exchanger of the present invention illustrating generally orthogonal fluid passageways.

FIG. 5 is a pictorial view of a fifth embodiment of the heat exchanger of the present invention illustrating a device mounted on the heat exchanger.

FIGS. 8a–8c are a pictorial view of a one embodiment of a heat exchanging chassis of the present invention.

DESCRIPTION OF PREFERRED EMBODIMENTS

Figure 1:
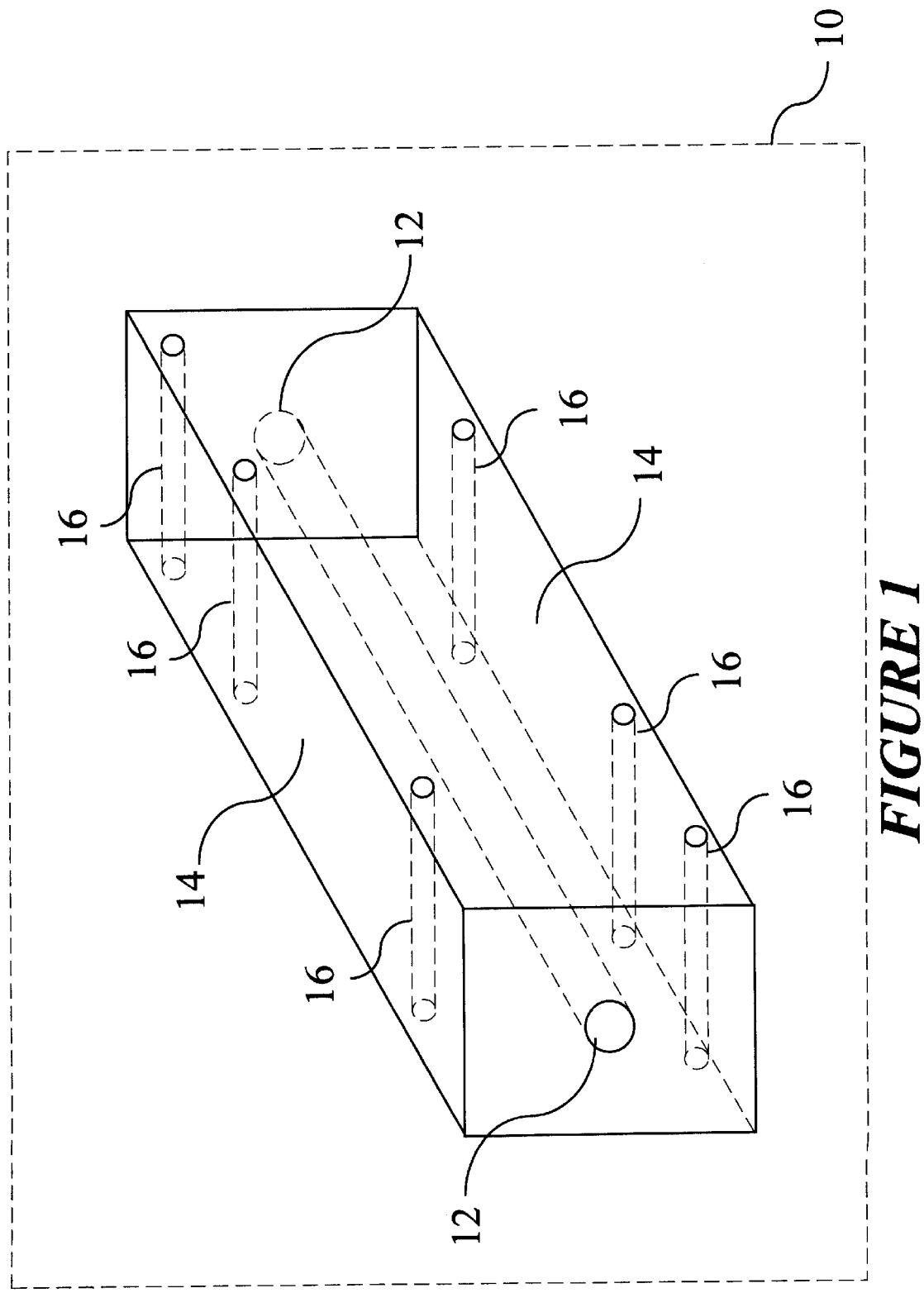
FIG. 1 is a pictorial view of one embodiment of a heat exchanger of the present invention.

With reference to FIG. 1, heat exchanger 10 may be a rigid elongated member having at least one fluid coolant channel 12, a plurality of flat surfaces 14, and thermal expansion holes 16. Electrical devices such as power modules may be mounted on the flat surfaces 14. The heat exchanger 10 may serve as a chassis for mounting power semiconductor devices, electronic parts, printed circuit boards, and passive power components such as thick film resistors.

The heat exchanger 10 may be manufactured with "high k" (thermally conductive) materials having electrically conductive or dielectric properties such as Copper (Cu) and Beryllium oxide (BeO). Other materials include silicon carbide (SiC), aluminum nitride (AlN) and alumina ($Al_2O_3$). The heat exchanger may preferably be manufactured from a volume of metalized ceramic having undergone a DBC profile. Silicon may be mounted directly on a metalized ceramic heat exchanger which provides a reduction in thermal resistance, increases power, and provides an appropriate CTE match between silicon and heat exchanger. For other substrate materials such as copper, thermal expansion holes 16 may be formed in the metal substrate for modifying the composite coefficient of thermal expansion to approximate silicon. Methods of determining the composite CTE of objects are generally known in the art.

Power modules, power devices, or other circuitry may be bonded by brazing or soldering to the heat exchanger 10. The bond provides a low thermal resistance interface between heat generating devices and the heat exchanger 10.

Cross-sections of the heat exchanger 10 may preferably be rectangular but any cross-sectional shape may be used as long as mounting surfaces exist. For example, the heat exchanger may be a volume of honey comb material surrounded by a copper foil skin.

The "multi-sided" heat exchanger 10 is designed to increase dissipation area, provide low thermal resistance, provide a low thermal resistance bonding interface, and allow a direct composite coefficient of thermal expansion match between heat exchanger and silicon power die. To manufacture such a heat exchanger, a copper block may be drilled or extruded to form a chassis and covered with a metal foil or metalized to provide attachment surfaces, which can be patterned. Green ceramic heat exchangers may also be manufactured by extrusion.

Thermal performance of the heat exchanger 10 may be maximized by optimizing relations of power equation $$P=[(K)(A)(T_j-T_a)/L] \qquad (1)$$

where A is the total surface area,

L is the length of the semiconductor junction to coolant interface, $T_j$ is the junction temperature, $T_a$ is the coolant temperature, and K is the thermal conductivity of the interface.

In operation, devices (not shown) mounted on the plurality of surfaces 14 generate heat. Heat generated may be transferred to the heat exchanger 10 through a low thermal resistance bond with the heat exchanger 10. The generated heat may be transferred away from the heat exchanger by passing a fluid coolant through the channel 12. Plural channels may be used to increase the surface contact area of the coolant to the heat exchanger. Heat may also be transferred away from the heat exchanger without using a channel 12. For example, planar surfaces of the heat exchanger 10 may be placed in contact with a coolant.

As shown in FIG. 2, there may be a number of passageways through the heat exchanger, all the same size or variable in size to modify the rate of heat flow. In FIG. 3, the passageways nearest the skin are larger to accommodate greater fluid flow nearest the devices to be bonded to the flat surfaces. In FIG. 4, the larger diameter passageways are nearest the center of the heat exchanger.

Figures 6, 7:
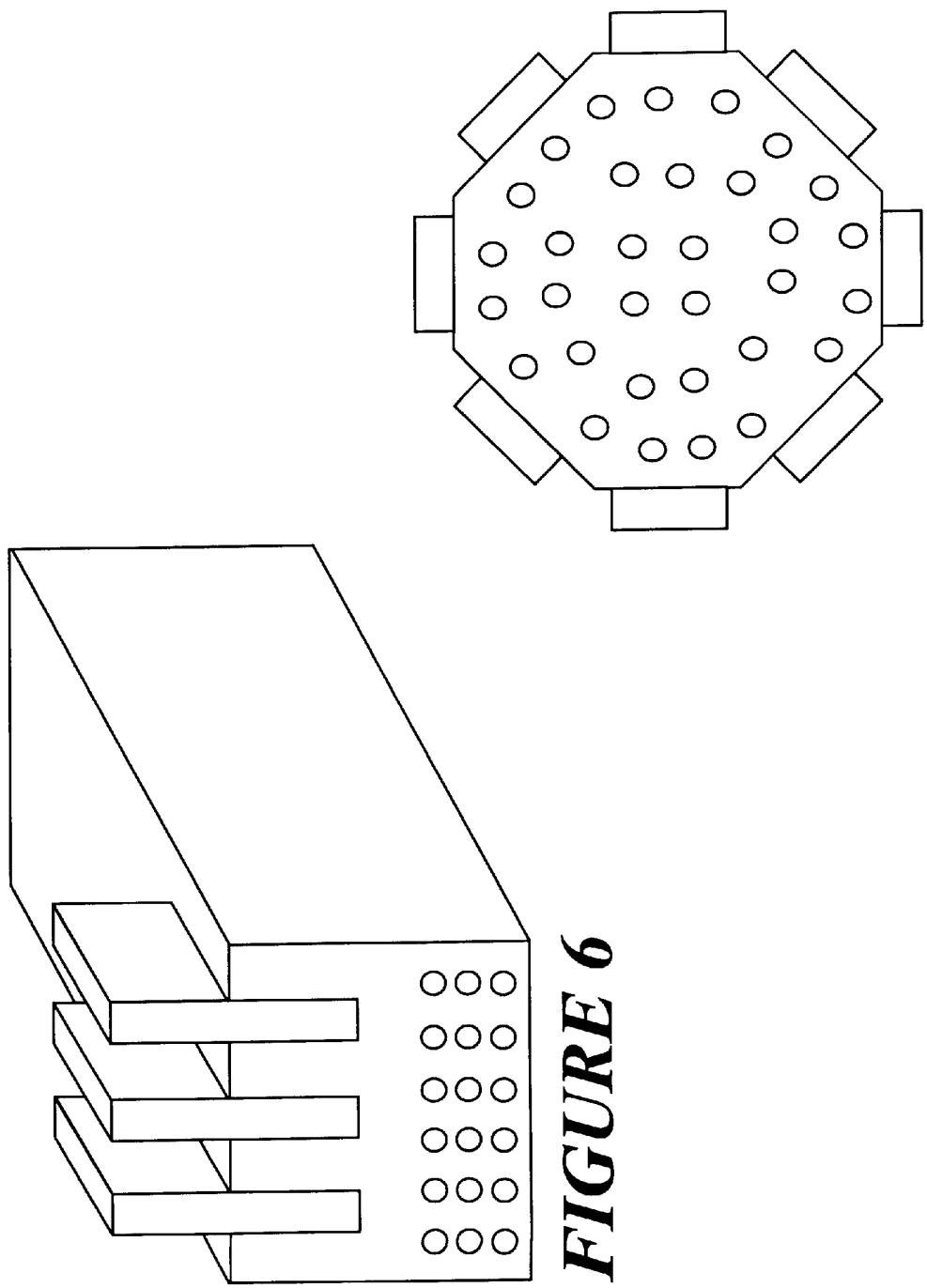
FIG. 6 is a pictorial view of a sixth embodiment of the heat exchanger of the present invention illustrating slot mounting of the HTP assemblies.
FIG. 7 is a top plan view of a seventh embodiment of the heat exchanger of the present invention illustrating an octagon construction with devices mounted on each of the vertical surfaces and vertical fluid passageways.

As shown in FIGS. 4 and 5 the passageways may extend through the heat exchanger in directions normal to each other, and in FIG. 6 the passageways may be located at one end of the heat exchanger so that HPT assemblies may be slotted into the heat exchanger from the other end.

The heat exchangers of the present invention may be any convenient shape so long as they possess the surfaces to which to bond the devices to be cooled. As shown in FIG. 7, the heat exchanger may be an octagon in cross section and may have vertical passageways extending therethrough.

Figure 8A:
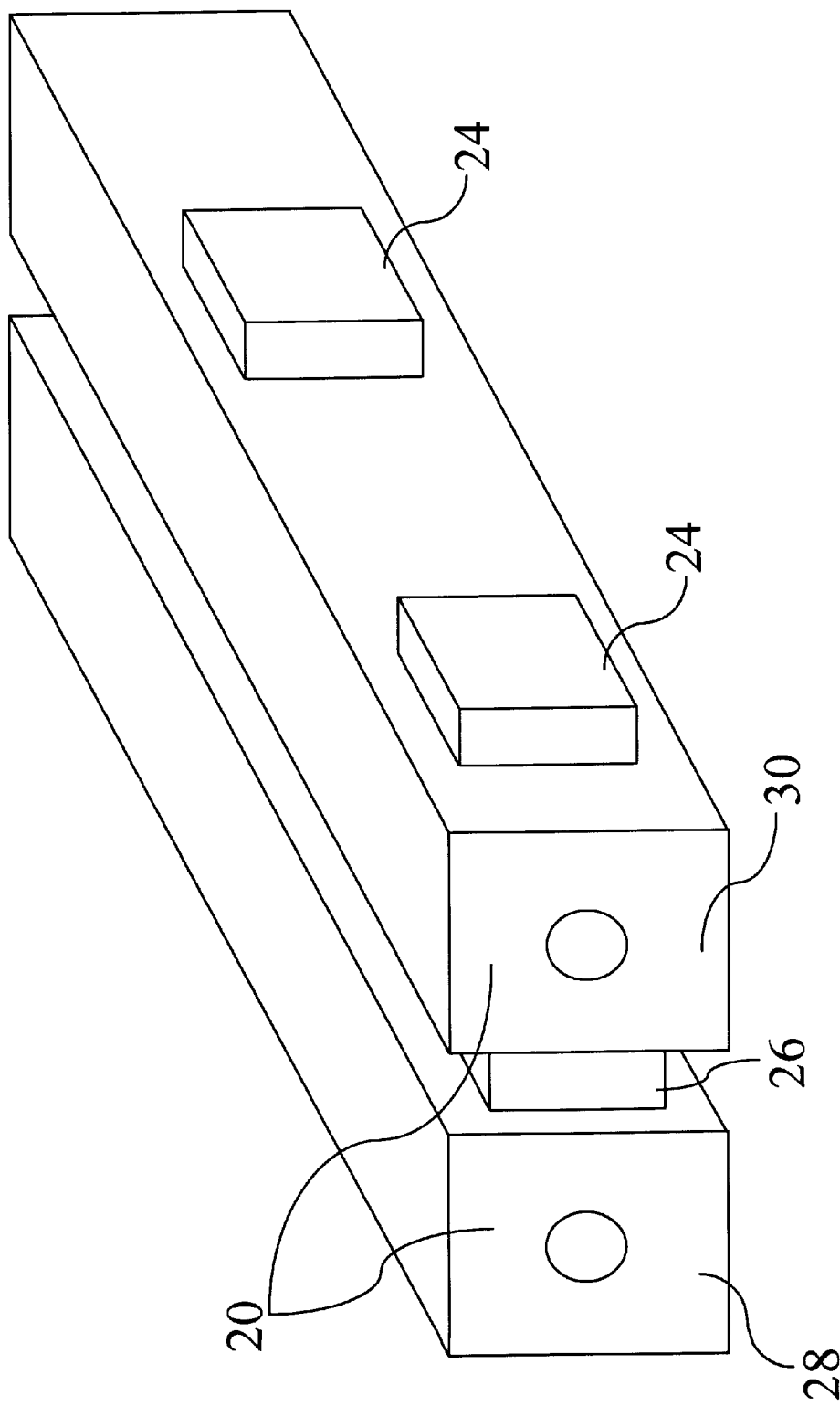

With reference to FIG. 8, the heat exchanging chassis 20 may include two spaced apart heat exchangers 28 and 30. Together the heat exchanging chassis 20 and electronic devices 24 and 26 may form a power pack sub-assembly. Additional electronic devices may be bonded to sides of each heat exchanger 28 and 30. For example, heat exchanger 28 may be rotated to a vertical position in order to use all four areas of the heat exchanger for power devices and other electronic devices 24 and 26 which may be attached by low thermal resistance methods.

The structure of the chassis 20 significantly increases the mounting and cooling area of a power pack using a simple rectangular geometry. Other heat exchanger geometry's such as hexagons or milled slots may increase area and power dissipation but increase cost and complexity. Top or double sided power device cooling may be provided by attaching the top side of an electronic device such as a power module 26 to second heat exchanger 30. Power device mounting and location on the chassis 20 may be determined according to heat dissipation requirements.

Figure 9:
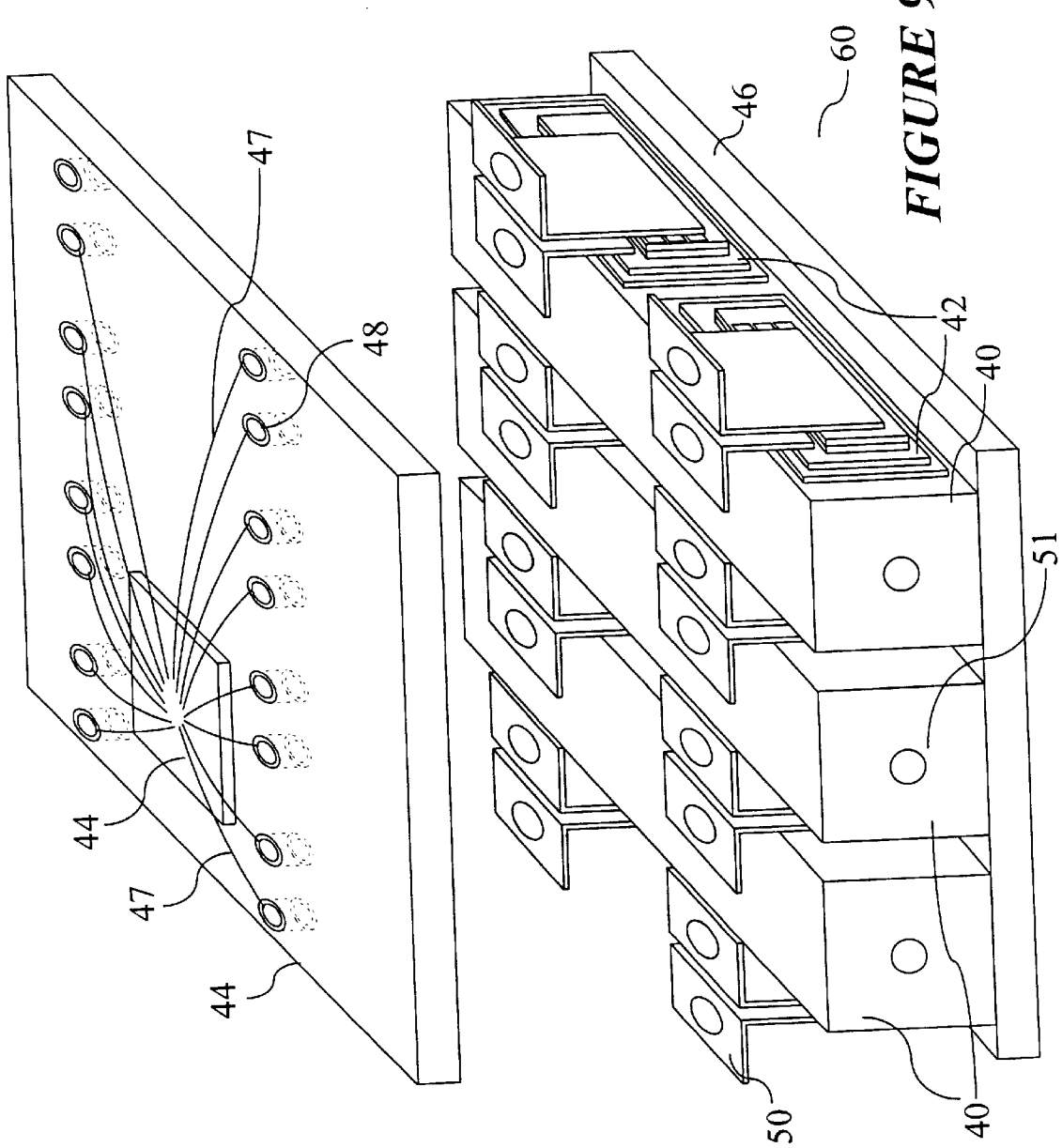
FIG. 9 is a pictorial view of a one embodiment of a heat exchanging power pack of the present invention.

With reference to FIG. 9, a power pack 60 may include a heat exchanging chassis 40, power modules 42, and a frame which includes a power pack cover 44, a chassis support plate 46 and the circuity 47 carried by the cover 44. The heat exchanging chassis may include plural heat exchangers spaced apart from each other.

The power modules 42 may be bonded to the chassis 40 to provide support and cooling for the power modules 42. Other devices may also be bonded to the chassis for support and cooling. The chassis support plate 46 may be a metal or ceramic substrate that may also serve as heat exchanger. The cover 44 may be a ceramic substrate having metalized surfaces patterned for bonding with circuitry 47. The circuity 46 may include a snubber, power device driver circuitry, and/or power pack configuration circuitry. Holes 48 provide electrical conduction path to the interior of the power pack for connection with the power modules 42.

Some thermal management may be provided for the circuitry 47 on the cover 44 through the physical connections with the power modules 42 such as by connecting power module striplines 50 to the cover 44 and cooling the circuitry 47 on the cover 44 with the heat exchanging chassis 40 through the power modules 42. Short striplined electrodes from the power modules 42 may be connected to "sliding female" or "Pem nut" interfaces (not shown). A "sliding male" or screw interface allows an electrical and thermal connection from the cover 44 to the chassis 40. High "K" materials such as ceramics and back filled epoxy may be used to enhance thermal management.

The power pack 60 may include only one heat exchanger 51 which may be configured with circuitry 47 as a half-bridge, a full-bridge, AC switch or other special circuit. An example of circuitry 47 may be a circuit integrating a non-inductive current resistor, a damping resistor, and a discharge capacitor. Also film resistors may be used.

The power pack 60 provides a novel approach in device configuration, package inductance, snubbing, current sensing, CTE matching and component cooling.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A power pack for providing a source of electrical energy comprising:

a plurality of power modules for providing a source of electrical energy;

a plurality of spaced apart heat exchangers disposed in a heat transfer relationship with at least one of said plurality of power modules for providing at least one-sided cooling of each of said plurality of power modules;

each of said heat exchangers being a solid elongated member having a rectangular cross-section;

each of said heat exchangers having a cooling interface adapted to contact a fluid coolant for transferring to the fluid coolant heat to be generated by said plurality of power modules; and a frame enclosing said plurality of power modules comprising:

a support plate supporting said plurality of power modules;

a cover covering and configuring said plurality of power modules; and circuitry mounted on a surface of said cover opposite said plurality of heat exchangers for controlling said plurality of heat exchangers for controlling the said plurality of power modules and for substantially limiting voltage overshoot;

said cover having a thermal conduction medium for transferring heat being generated by said circuitry to heat exchangers, so that said plurality of power modules are carried and cooled by said heat exchangers which are enclosed in a frame having said circuitry for configuring said plurality of power modules and for limiting voltage overshoot of said plurality of power modules.

2. The power pack of claim 1 wherein said cover comprises a ceramic substrate having metalized surfaces for bonding with said circuitry.

3. The power pack of claim 1 wherein at least one of said plurality of spaced apart heat exchangers having a metalized surface for bonding electronic devices directly on to said one of said plurality of heat exchangers.

4. The power pack of claim 1 wherein each of said plurality of power modules having a stripline connection for providing an electrical connection to said circuitry.

5. The power pack of claim 1 wherein at least one of said plurality of heat exchangers comprises a copper substrate.

6. The power pack of claim 1 wherein at least one of said plurality of heat exchangers comprises a ceramic substrate.

* * * * *